United States Patent
Stahl (10) Patent No.: US 6,460,772 B1
(45) Date of Patent: *Oct. 8, 2002

(54) PCMCIA SMART CARD READER

(75) Inventor: Karl Erik Stahl, Varmdo (SE)

(73) Assignee: Intertex Data AB, Varmdo (SE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/145,035

(22) Filed: Sep. 1, 1998

(51) Int. Cl.[7] ................................................. G06K 7/00
(52) U.S. Cl. ....................................... 235/486; 235/482
(58) Field of Search ................................. 235/486, 492, 235/459, 482, 451; 361/737, 752

(56) References Cited

U.S. PATENT DOCUMENTS

| | | | |
|---|---|---|---|
| 4,975,805 A | * 12/1990 | Schmutzler | 361/399 |
| 5,184,282 A | 2/1993 | Kaneda et al. | |
| 5,198,645 A | * 3/1993 | Martin et al. | 235/441 |
| 5,315,478 A | * 5/1994 | Cadwell et al. | 361/684 |
| 5,330,360 A | * 7/1994 | Marsh et al. | 439/76 |
| 5,375,037 A | 12/1994 | Le Roux | |
| 5,400,216 A | 3/1995 | Tsai | |
| 5,430,617 A | * 7/1995 | Hsu | 361/818 |
| 5,457,601 A | * 10/1995 | Georgopulos et al. | 361/686 |
| 5,473,505 A | * 12/1995 | Kessoku et al. | 361/684 |
| 5,486,687 A | 1/1996 | Le Roux | |
| 5,500,517 A | 3/1996 | Cagliostro | |
| 5,521,363 A | 5/1996 | Tannenbaum | |
| 5,563,400 A | * 10/1996 | Le Roux | 235/486 |
| 5,619,396 A | 4/1997 | Gee et al. | |
| 5,625,534 A | * 4/1997 | Okaya et al. | 361/686 |
| 5,651,068 A | 7/1997 | Klemba et al. | |
| 5,657,028 A | 8/1997 | Sanad | |
| 5,661,635 A | 8/1997 | Huffman et al. | |
| 5,663,553 A | * 9/1997 | Aucsmith | 235/492 |
| 5,664,228 A | 9/1997 | Mital | |
| 5,673,180 A | * 9/1997 | Pernet | 361/756 |
| 5,677,524 A | * 10/1997 | Haghiri-Tehrani | 235/492 |
| 5,679,007 A | * 10/1997 | Potdevin et al. | 439/76.1 |
| D386,475 S | 11/1997 | Hiramatsu | |
| 5,692,914 A | * 12/1997 | Mitani et al. | 439/131 |
| 5,716,221 A | * 2/1998 | Kantner | 439/64 |
| 5,731,629 A | 3/1998 | Woodward | |
| 5,752,857 A | * 5/1998 | Knights | 439/638 |
| 5,820,414 A | * 10/1998 | Omori | 439/638 |
| 5,835,596 A | * 11/1998 | Klemba et al. | 380/25 |
| 5,936,226 A | * 8/1999 | Aucsmith | 235/492 |
| 5,955,722 A | * 9/1999 | Kyrz et al. | 235/479 |
| 5,995,025 A | * 11/1999 | Sternglass et al. | 341/22 |
| 6,042,009 A | * 3/2000 | Barrett et al. | 235/441 |

FOREIGN PATENT DOCUMENTS

| | | |
|---|---|---|
| DE | 297 23 227 U1 | 7/1998 |
| EP | 0 716 565 A1 | 6/1992 |
| EP | 0 950 974 A1 | 10/1999 |

* cited by examiner

*Primary Examiner*—Karl D. Frech (57) ABSTRACT

A PCMCIA smart card reader with no protruding portion, with a stable mechanical design, allowing space for additional functions to be included in the PCMCIA card and that eases the insertion of a smart card. A thin support is formed between a thin upper section and a lower section of the PCMCIA smart card reader at an opening forming a smart card slot. The support is outside the smart card slot, but positioned within the PCMCIA slot and is preferably an integrated part of a PCMCIA card top cover. Since the support guides the smart card laterally at the opening of the smart card slot, only a small portion of the smart card has to be inserted into the PCMCIA card. The limited insertion of the smart card and the location, of contacts for interfacing with the smart card in the thin upper section of the smart card reader, creates space for other functions to be included in the PCMCIA card, for example, a modem. The smart card insertion is eased by a removable extension supporting. the smart card vertically during the insertion of the smart card. The removable extension may be a cable connection plug.

21 Claims, 7 Drawing Sheets

PCMCIA SMART CARD READER

BACKGROUND OF THE INVENTION

The present invention relates to a smart card reader in general. More particularly, the present invention relates to a smart card reader built into a PCMCIA card (also called a PC Card).

Consumer use of credit cards, identification cards for giving access to certain premises, and bank cards, also referred to as "cash cards", etc., has steadily increased in recent years. This increased consumer activity, combined with advances in the portable computer market, has resulted in a significant increase in the use of a new type of information device, commonly referred to as "smart cards". Despite being the same size as a conventional credit card, which stores information on a magnetic strip, the smart card stores significantly more information than the credit card by using an integrated microprocessor chip located within the body of the smart card. The microprocessor chip enables the smart card to store and secure a wide variety of information, including monetary value for retail and vending machine use, personal information such as medical and healthcare records, and so forth. Depending on the microprocessor chip capabilities, new information and/or applications may also be added in the field.

In addition to storing more information, smart cards are more reliable, perform multiple functions, and utilize high security mechanisms such as advanced encryption to increase security. This ability for increased security is expected to be a significant factor in making the smart card an integral part of retail trade via the Internet. All of the storage and security advantages of the smart card have contributed to an increased growth in smart card applications.

Smart cards are often used in applications requiring communication via a telephone line modem.

Smart card readers are used to communicate with the smart card. When the smart card is inserted in the smart card reader, the smart card reader reads and writes information from and to the smart card through smart card contacts that connect to terminal points on the smart card surface. The terminal points are connected to the microprocessor chip inside the smart card. The smart card has to be accurately aligned with the smart card reader in order to assure a reliable electrical connection with the terminal points. In addition to the smart card contacts, the smart card reader also includes electronic components and often a microprocessor that interfaces with the smart card. Smart card readers can be separate devices connected to the serial port of a personal computer or can be built into other equipment such as bank terminals, personal computer keyboards, or modems, etc.

Portable computers often have one or two expansion slots standardized by the Personal Computer Memory Card International Association ("PCMCIA"). PCMCIA cards (also called PC Cards) can be inserted into these slots to expand the functionality of the computer. Extra memory, modems, GSM adapters, ethernet adapters and smart cards readers are examples of PCMCIA cards. A PCMCIA card also has the same width and length as a credit card, but is thicker, usually 5 mm. Several functions can also be combined into the same PCMCIA card.

Smart card functionality can be added to a portable computer by inserting a PCMCIA smart card reader into a free expansion slot. Since smart cards are often used in applications requiring communication by a modem, a LAN, or an ISDN adapter, the limited number of available expansion slots makes it highly desirable to combine the PCMCIA smart card reader with a modem or other function.

However, since the length and width of a smart card is the same as the length and width of a PCMCIA card, the mechanical realization of a PCMCIA smart card reader is difficult. When a slot is formed in the PCMCIA card for inserting the smart card, it separates the PCMCIA card into an upper section and a lower section. Because the width of the smart card is equal to the width of the PCMCIA card, there is no room for a mechanical support between the upper and lower sections within the specified dimensions of a PCMCIA card.

This lack of available space for a mechanical support between the upper portion and lower portion can be seen in the prior art PCMCIA smart card readers illustrated in FIGS. 1A–1D.

Figure 1A:
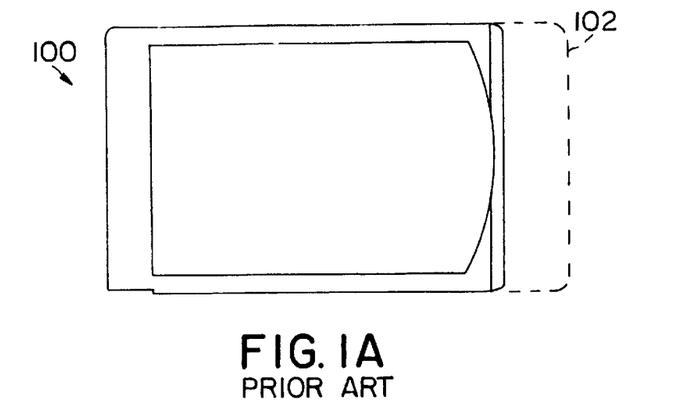
FIG. 1A is a top view of a Prior Art PCMCIA smart card reader.
Figure 1B:
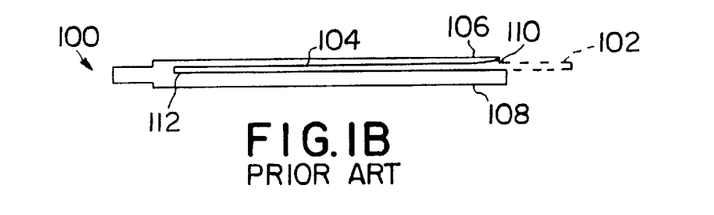
FIG. 1B is a side view of the Prior Art PCMCIA smart card reader of FIG. 1A.

As illustrated in FIGS. 1A and 1B, a prior art smart card reader 100 has a length and width that is equal to a length and width of a smart card 102. A slot 104 for receiving the smart card 102 is formed by an upper section 106 and a lower section 108 of smart card reader 100. As illustrated in FIG. 1B, upper section 106 is thinner than lower section 108. A smart card contact (not shown) is located along lower section 108, at an innermost end 112 of slot 104. When the smart card 102 is fully inserted into slot 104 of smart card reader 100, the terminal points on the smart card surface come in contact with the smart card contact of smart card reader 100.

The type of smart card reader illustrated in FIGS. 1A and 1B has no mechanical support between the front end of upper section 106 and lower section 108, making the long unsupported upper section 106 of the smart card reader weak. The function of the upper section 106 is to push the smart card against the smart card contact to assure electrical contact. However, when the smart card is to be inserted, it is not guided or aligned laterally by the smart card reader itself. Only the guides inside the PCMCIA slot, which are meant to guide the PCMCIA card, will guide the smart card. Since the guides are located at some distance from the slot opening within the PCMCIA card slot, the smart card must be inserted a significant distance within the PCMCIA card slot before receiving sufficient support by the guides. The long smart card slot 104 occupies a large amount of space within the PCMCIA card, limiting the room for additional functions.

Figure 1C:
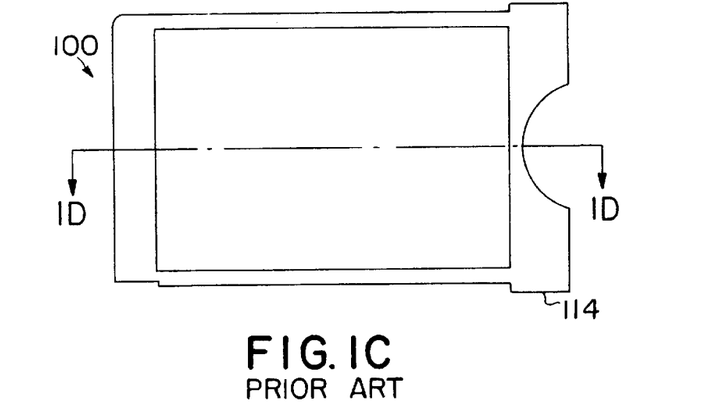
FIG. 1C is a top view of a Prior Art PCMCIA smart card reader.
Figure 1D:
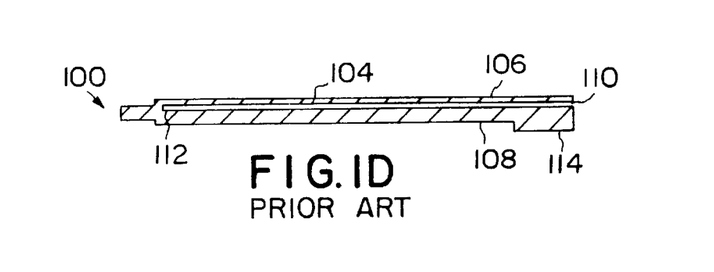
FIG. 1D is a cross-sectional side view of the Prior Art PCMCIA smart card reader of FIG. 1C, taken along section line 1D—1D.

The type of smart card reader illustrated in FIGS. 1C and 1D adds mechanical support between the upper and lower sections 106 and 108 including guiding for the smart card insertion. However, since the PCMCIA and smart card standards stipulate the same width of 1F both cards, the support cannot be placed within the standardized dimensions of the PCMCIA card without intruding within the space required for inserting the smart card within the PCMCIA card. Instead, a support 114 is placed such that the length of the PCMCIA card is increased, which causes smart card reader 100 to extend outside of the PCMCIA card slot of the computer device, making smart card reader 100 prone to physical damage during transport of the computer device. As a result, smart card reader 100 must be removed when transporting the computer device, which tends to be annoying given the portable nature of a lap top computer device.

In both types of prior art smart card readers illustrated in FIGS. 1A–1D, a printed circuit board, ("PCB"), (not shown) is positioned along lower thicker section 108 of smart card reader 100. The PCB houses both electronic components for the smart card reader as well as the smart card contact. The electronic components and the smart card contact are soldered to the bottom side of the circuit board with the smart card contact arising from a hole in the PCB. When inserting the smart card 102, it rides along the top surface of the PCB. Therefore, only the bottom side of the PCB can be used for mounting components and the available space is further limited by the smart card contact. Thus, room for additional functions within the PCMCIA card is very limited. The hole in the PCB for the smart card contact is a further obstacle when adding modem functionality, which requires a high voltage insulation barrier to the telephone line connection.

Another problem in PCMCIA smart card readers is that the PCMCIA card slot is normally located at the side of the computer. It is therefore difficult for a user to see the slot in which the smart card is to be inserted, making insertion of the smart card difficult.

BRIEF SUMMARY OF THE INVENTION

It is therefore an object of the present invention to provide a PCMCIA smart card reader that is mechanically stable and still fits entirely within a PCMCIA slot.

It is a further object of the present invention to provide a PCMCIA smart card reader that more efficiently uses the available space inside the PCMCIA card to allow additional functions to be included.

It is another further object of the present invention to provide a PCMCIA smart card reader that makes insertion of a smart card less difficult.

The objective of realizing a stable mechanical design without any protruding part from the computer is achieved by forming a very thin support between the upper and lower sections of the smart card reader at the opening of the smart card slot, where some lateral space normally is available inside the PCMCIA card slot. The support is preferably an integrated part of the PCMCIA top cover which usually is made of 0.2 mm stainless steel. The support between the upper and lower sections of the smart card reader also serves to guide the smart card laterally. Therefore, according to the invention, there is provided a smart card reading apparatus that fits inside a PCMCIA slot in a computing device. The smart card reading apparatus includes upper and lower sections having at a front end an opening to form a smart card slot for insertion of a smart card, and a lateral smart card guide member located close to the front end outside of the smart card slot, so that the smart card reading apparatus is positionable substantially within the PCMCIA slot. According to the invention, there is also provided a smart card reading apparatus to fit inside a PCMCIA slot in a computing device that includes upper and lower sections having at a front end an opening to form a smart card slot for insertion of a smart card, and a smart card guide member located adjacent the front end outside the smart card slot and positionable inside the PCMCIA slot. By being "positionable substantially within" the PCMCIA slot as noted above, the smart card reading apparatus is considered to be positioned entirely within the PCMCIA slot, or in such a way that there may be some minor extension, such as those due to manufacturing tolerances, but with no protruding parts, such as those interfering with transport of a computer device in which the smart card reading apparatus is inserted.

The objective of more efficient usage of the available space inside the PCMCIA card is achieved by the above described design, which allows that only a small portion of the smart card is inserted into the PCMCIA card, and by integrating the smart card contact with the thin upper section of the smart card reader instead of the thicker lower section as in the prior art. Therefore, according to the invention, there is provided a smart card reading apparatus to fit inside a PCMCIA slot in a computing device having a thin upper section and a lower section containing electronic components for the smart card reader. The upper and lower sections have, at a front end, an opening to form a smart card slot for insertion of a smart card. The smart card reading apparatus also has an interfacing means for communicating with a smart card inserted into the smart card slot arranged in the thin upper section.

The objective of easing the insertion of the smart card is achieved by adding to the above described design, which guides the smart card insertion laterally, a removable extension to the smart card reader forming a horizontal support surface for the smart card. The removable extension is preferably integrated with a connector for an additional function in the PCMCIA card, e.g. the telephone cable connector of a modem function.

BRIEF DESCRIPTION OF THE DRAWINGS

These and other objects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Reference will now be made in detail to the preferred embodiments of the present invention, examples of which are illustrated in the accompanying drawings, wherein like reference numerals refer to like elements throughout.

Figure 2A:
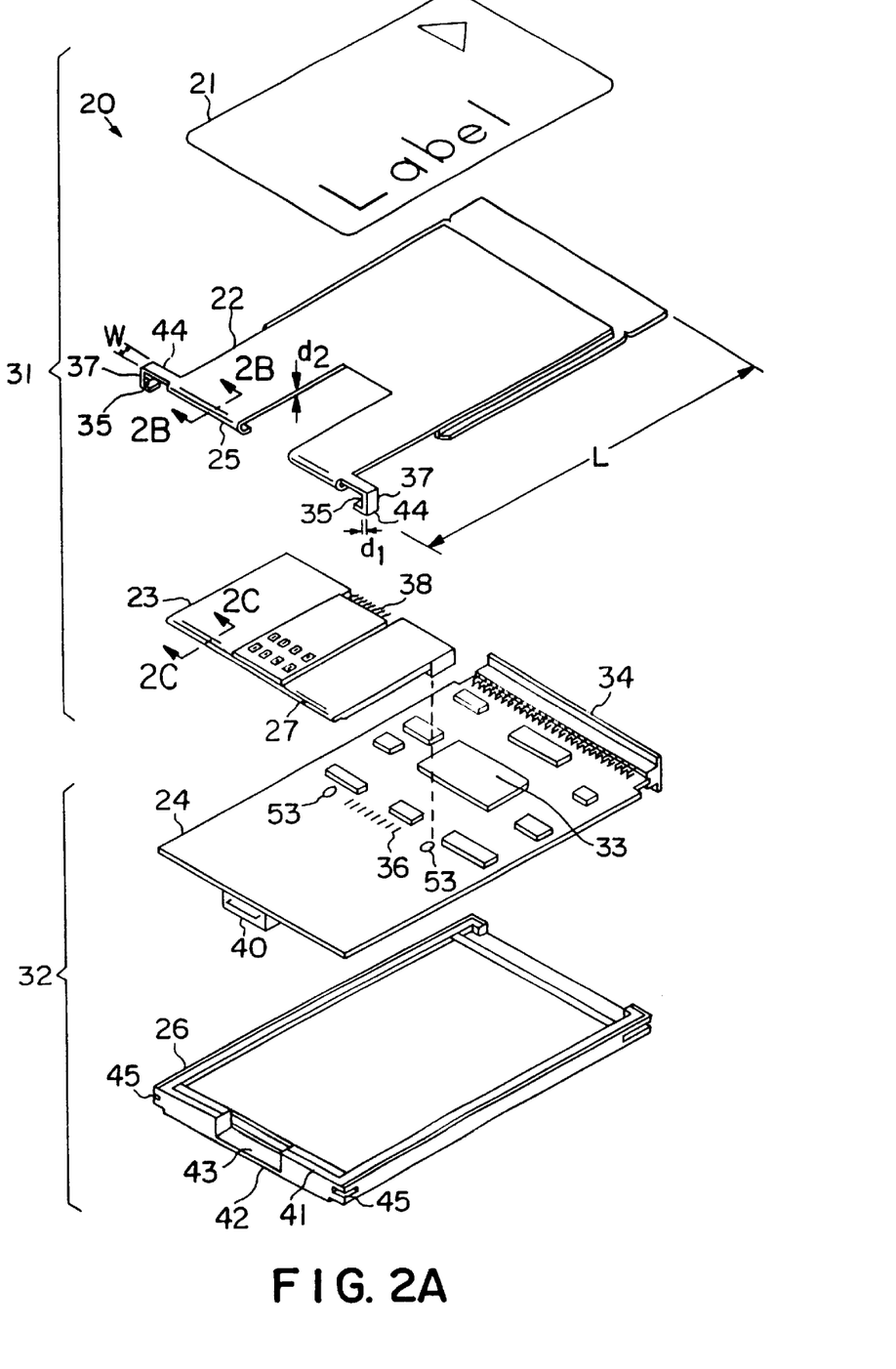
FIG. 2A is an exploded perspective view of a PCMCIA smart card reader according to a preferred embodiment of the present invention.
Figure 3:
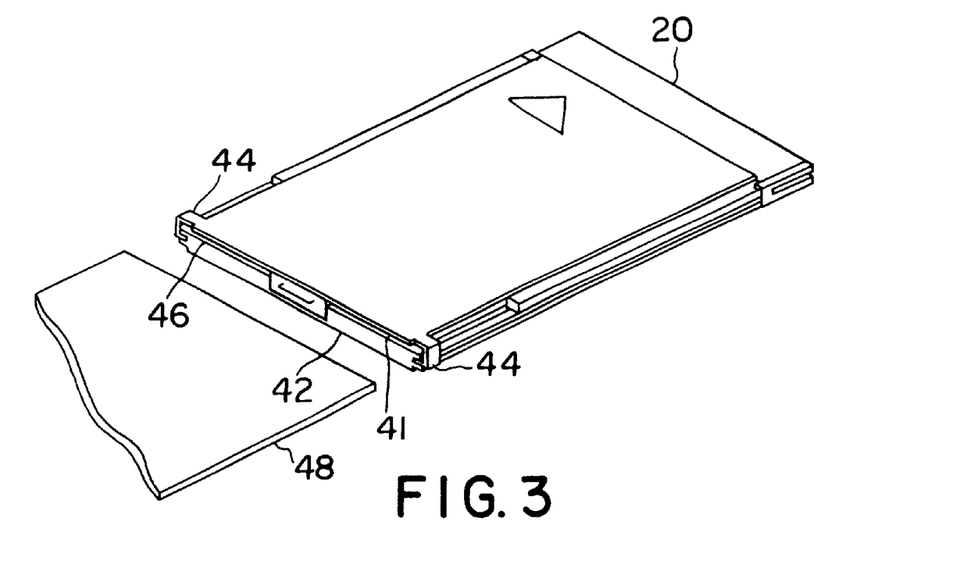
FIG. 3 is a perspective view of a fully assembled PCMCIA smart card reader according to a preferred embodiment of the present invention, illustrating insertion of a smart card into the PCMCIA smart card reader.

A PCMCIA smart card reader 20, according to a preferred embodiment of the present invention, is illustrated in FIG. 2A. PCMCIA smart card reader 20 includes a label 21, an upper section 31 including a top cover 22 and a reading member 23, a lower section 32 including a printed circuit board 24 and a bottom cover 26, all having corresponding rectangular configurations. As illustrated in FIGS. 2A and 3, label 21 is placed on top cover 22, and top cover 22 and bottom cover 26 are fitted together when PCMCIA smart card reader 20 is fully assembled, to enclose reading member 23 and printed circuit board 24.

Figure 2B:
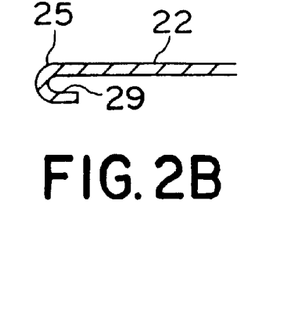
FIG. 2B is a cross-sectional side view of a top section of the PCMCIA smart card reader of FIG. 2A, taken along section line 2B—2B.
Figure 2C:
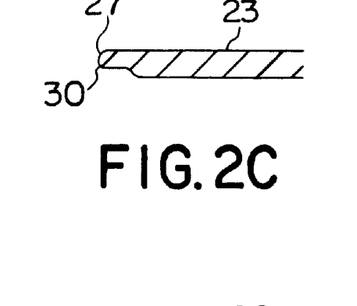
FIG. 2C is a cross-sectional side view of a reading member of the PCMCIA smart card reader of FIG. 2A taken along section line 2C—2C.

As illustrated in FIGS. 2A–2C, both top cover 22 and reading member 23 include matching front ends 25 and 27, respectively. As illustrated in FIG. 2B, front end 25 of top cover 22 includes a rounded inner portion 29, while, as illustrated in FIG. 2C, front end 27 of reading member 23 includes a rounded outer portion 30. Rounded inner portion 29 of top cover 22 is formed to receive rounded outer portion 30 of reading member 23 so that front end 27 of reading member 23 is fittingly engaged with top cover 22 when PCMCIA smart card reader 20 is fully assembled. Other methods and structures for fixing reading member 23 to top cover 22 are also possible.

Figure 4:
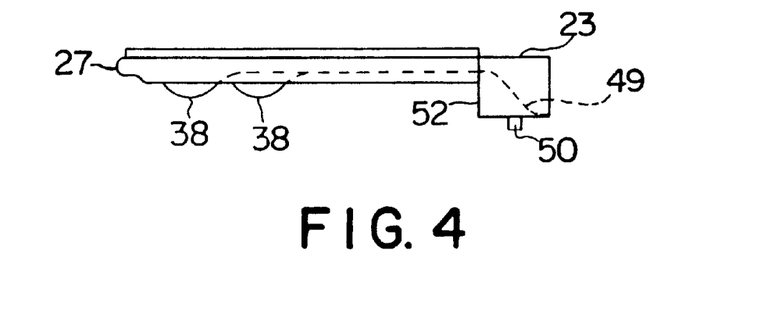
FIG. 4 is an exaggerated side view of a reading member of a PCMCIA smart card reader according to a preferred embodiment of the present invention.

Reading member 23, as illustrated in an exaggerated dimensional form in FIG. 4, includes mechanical contact springs 38 for making electrical contact to the termination points on the surface of the smart card. However, in cases where the smart card uses other methods of reading from it and writing to it, such as inductive or capacitive coupling, radio waves or light, reading member 23 must incorporate a corresponding transducer. FIG. 4 is an exaggerated view in that, while reading member 23 has generally small dimensions, for example a thickness of 2mm and a length of 30mm, the dimensional features of reading member 23 are exaggerated for illustrative purposes only.

As illustrated in FIG. 2A, printed circuit board 24 includes electronic circuits and/or components 33 for both the smart card reader and for possible other functions. For example, in addition to having electronic circuits and/or components for smart card reading, PCMCIA smart card reader 20 also includes electronic circuits and/or components (not shown) for a modem, or other electronic communication device. Electronic circuits and/or components 33 of FIG. 4 are intended for illustrative purposes only, and the actual circuits and layout will vary, depending on the extent of the electronic features included in the PCMCIA card. A connector 34 to connect to the PCMCIA slot in a computer is soldered at one end, and the contact springs 38 of reading member 23 are soldered to soldering pads 36 positioned in a center portion of printed circuit board 24. The front portion of the upper surface of the printed circuit board 24 is free from electrical components and forms the lower floor of the smart card slot. The portion behind the reading member 23 of the upper surface of the printed circuit board 24 as well as the lower surface is available for mounting of electronic circuits and/or components 33. A female connecting portion 40 is located at a front end of the lower surface of printed circuit board 24 for connecting with an input/output connector, such as a telephone connector, which will be described later.

A front end 42 of bottom cover 26 includes an upper surface 41, and defines a substantially rectangular cut-out portion 43. Female connecting portion 40 of printed circuit board 24 is inserted in cut-out portion 43 when PCMCIA smart card reader 20 is fully assembled.

Flanges 44 located at each corner of front end 25 of top cover 22 extend downward and are inserted within corresponding slot portions 45 of bottom cover 26 to secure the front end of top cover 22 to bottom cover 26. As illustrated in FIG. 3, in a preferred embodiment of the present invention, flanges 44 are integral with top cover 22 and mechanically support upper section 31 at the front end of PCMCIA smart card reader 20. An opening 46 for insertion of a smart card is formed by flanges 44 and upper surface 41 of front end 42 of bottom cover 26. Opening 46 has a width extending between flanges 44 that is slightly larger than a smart card 48. For example, since smart card 48 typically has a width of 54.0 mm, according to a preferred embodiment of the present invention, the width of opening 46 is approximately equal to 54.2 mm. The flanges 44 serve two purposes, they guide the smart card 48 laterally and they mechanically support the thin upper section 31.

Both PCMCIA cards and smart cards have a standardized width of 54.0 mm. Since the distance between the flanges 44 has to exceed the smart card width, the flanges cannot be arranged within the standardized width of the PCMCIA card. However, as will be described later, there is extra width available at the opening of a PCMCIA slot which is utilized in the present invention.

As illustrated in FIG. 2A, according to a preferred embodiment of the present invention, flanges 44 have a width W that is approximately equal to 3 mm and are preferably very thin so as to enable opening 46 to be approximately equal to the width of smart card 48. For example, flanges 44 have a thickness $d_1$, corresponding to a thickness $d_2$ of top cover 22, which in a preferred embodiment of the present invention is approximately equal to 0.2 mm. Thus, as illustrated in FIG. 2A, an inside width extending between inside portions 35 of flanges 44 is approximately equal to 54.2 mm and an outside width extending between outside portions 37 of flanges 44 is approximately equal to 54.6 mm.

As illustrated in FIGS. 2A and 4, contact springs 38 of reading member 23 extend toward front end 27 of reading member 23 and are exposed along a bottom portion of reading member 23 to make contact with terminating points of smart card 48 when smart card 48 is inserted within PCMCIA smart card reader 20. Contact springs 38 are soldered to printed circuit board 24 at soldering points 49 to electrically connect reading member 23 to printed circuit board 24 at soldering pads 36. Tabs 50 (only one tab is shown) located at a back portion 52 of reading member 23 are inserted in corresponding holes 53 located on printed circuit board 24 to position and fasten reading member 23 onto printed circuit board 24.

By fittingly engaging front end 27 of reading member 23 within inner portion 29 of top cover 22 and by mechanically supporting upper section 31 through flanges 44, reading member 23 can be located in the upper section 31 of the PCMCIA card. Thus additional space is created along printed circuit board 24 to enable additional electronic functions to be included in the PCMCIA card. Further space is created by limiting the distance that smart card 48 is required to be inserted into PCMCIA smart card reader, which is made possible by the described guiding by flanges 44.

Figure 5A:
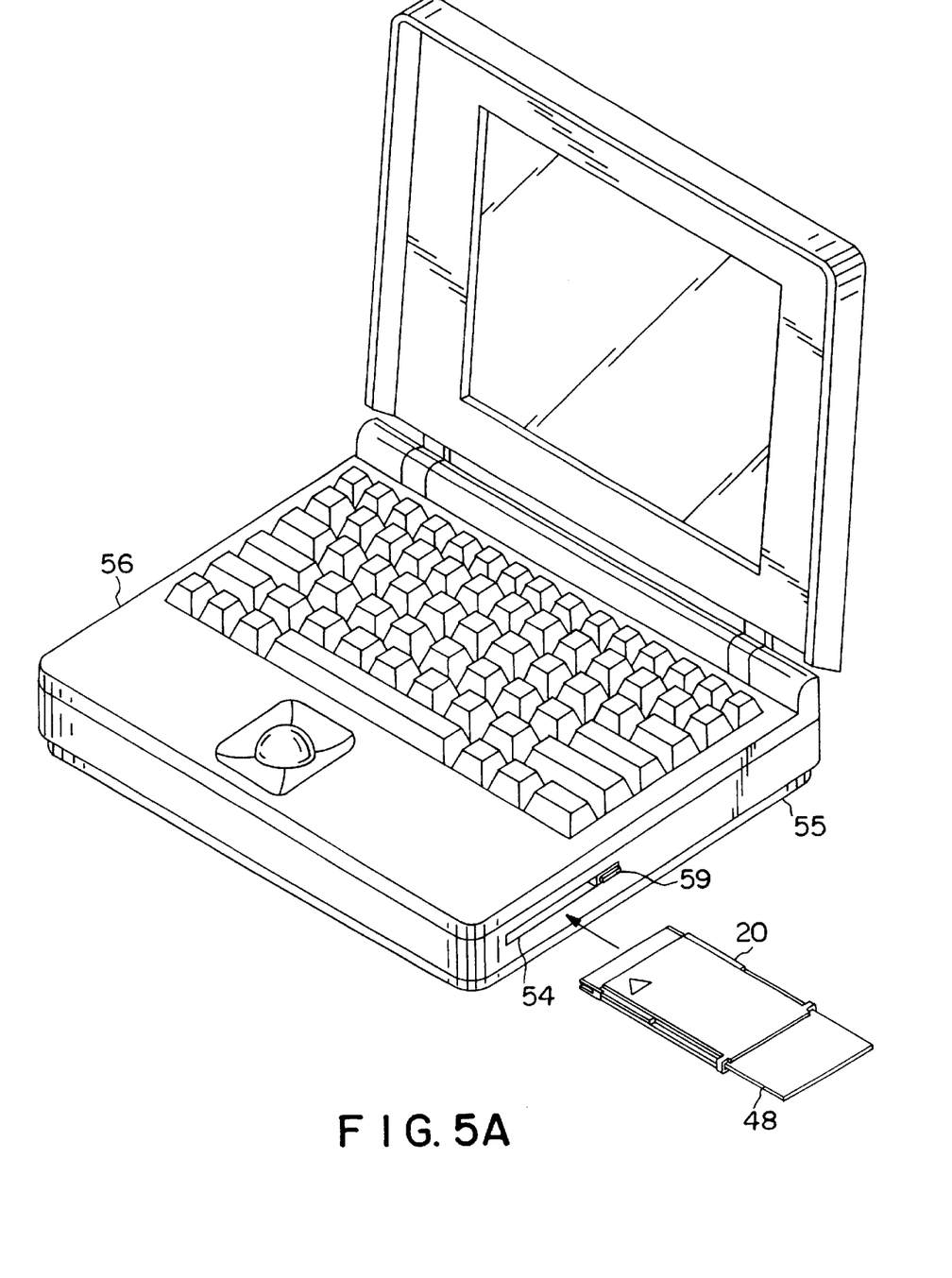
FIG. 5A is a perspective view of an insertion of a fully assembled PCMCIA smart card reader according to a preferred embodiment of the present invention within a card slot of a computer.
Figure 5B:
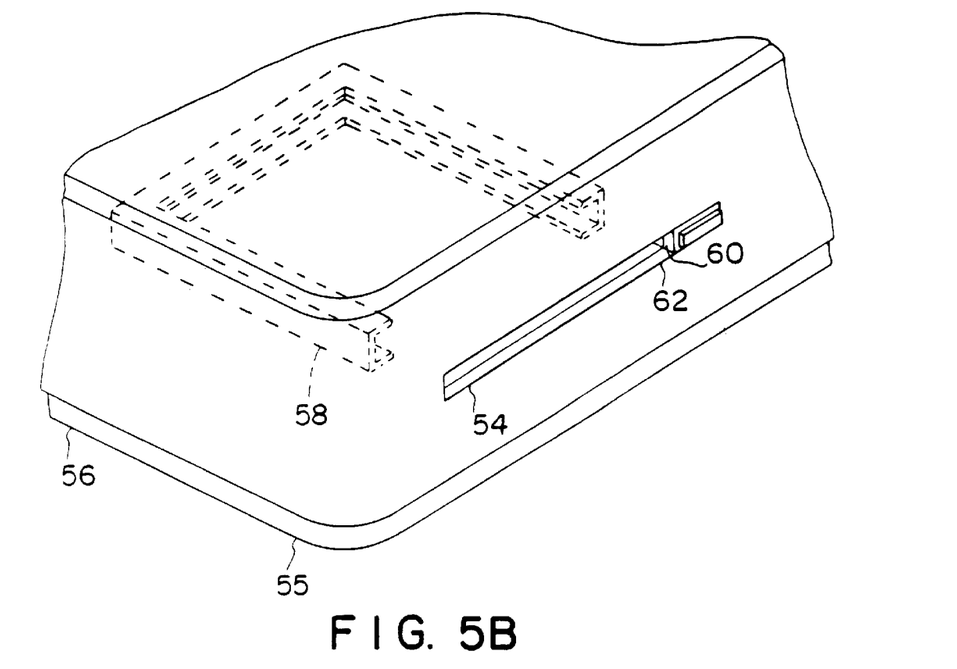
FIG. 5B is a partial perspective view of a guide positioned in a computer device.
Figure 5C:
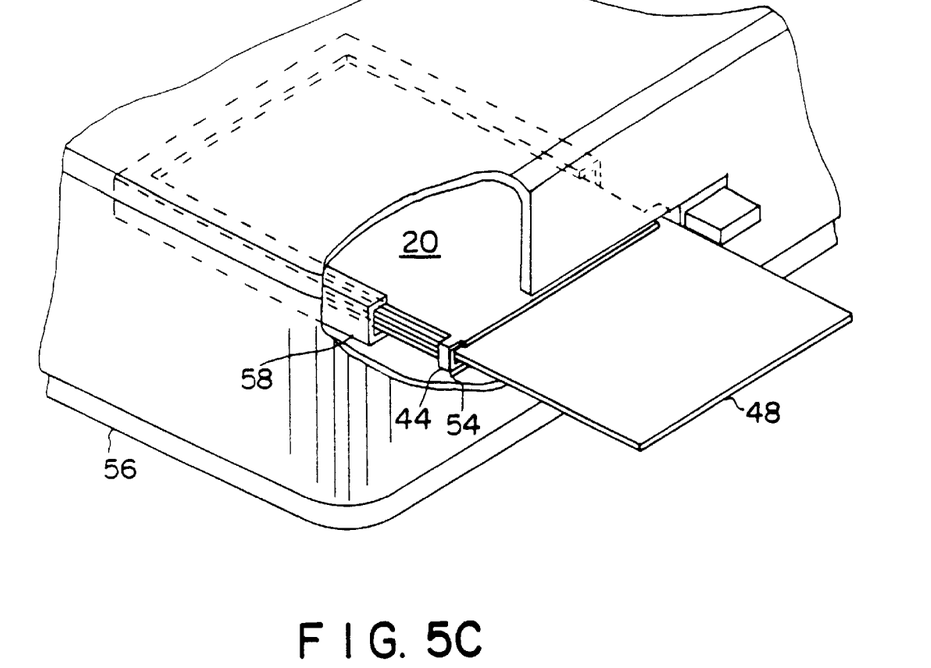
FIG. 5C is a partial perspective view illustrating insertion of a PCMCIA smart card reader according to a preferred embodiment of the present invention within a card slot of a computer device.

The insertion of PCMCIA smart card reader 20 into an electronic device is illustrated in FIGS. 5A–5C. PCMCIA smart card reader 20 is inserted into a PCMCIA card slot 54 that is located along a side portion of an outer case 55 of a portable or lap-top computer 56. When PCMCIA smart card reader 20 is fully inserted in card slot 54, connector 34 comes in contact with connectors (not shown) within portable computer 56 to provide an electrical connection between PCMCIA smart card reader 20 and portable computer 56. PCMCIA smart card reader 20 is removed from card slot 54 by depressing an eject button 59 located within the vicinity of card slot 54 of portable computer 56.

As illustrated in FIGS. 5B and 5C, when PCMCIA smart card reader 20 is inserted in card slot 54, PCMCIA smart card reader 20 is guided by guides 58 located within PCMCIA card slot 54 of portable computer 56. As illustrated in FIG. 5B, a space 60 is left between guides 58 and outer end 62 of card slot 54 and the width of the PCMCIA slot is somewhat larger than the width of the PCMCIA card. Therefore, it is possible to position the described flanges 44 close to the opening of the PCMCIA slot, outside ends of guides 58, but still within the PCMCIA slot.

Figure 6A:
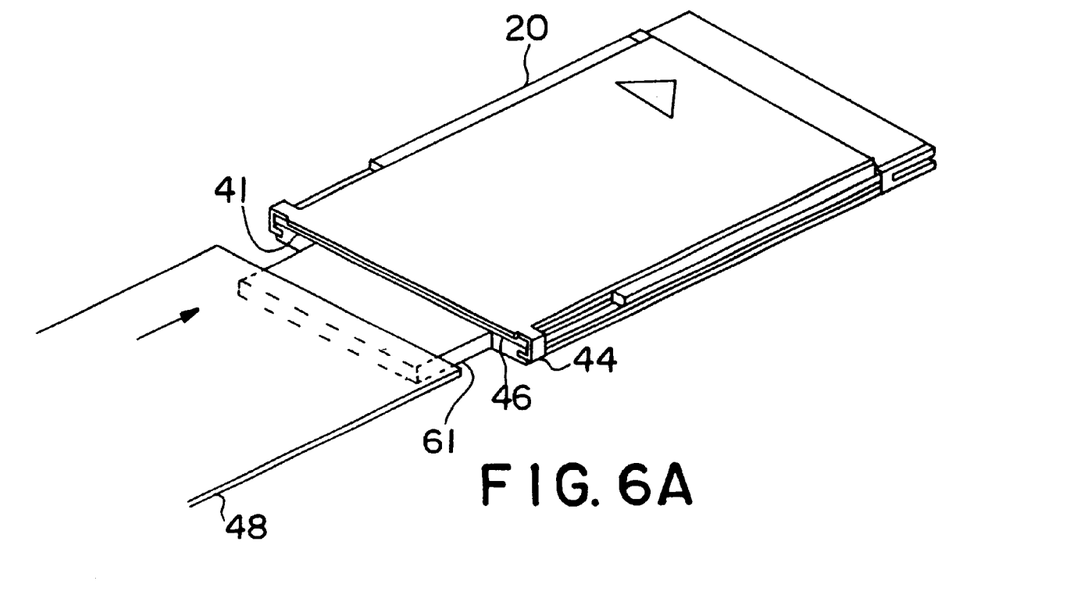
FIG. 6A is a perspective view of a removable extension of a PCMCIA smart card reader according to a preferred embodiment of the present invention.
Figure 6B:
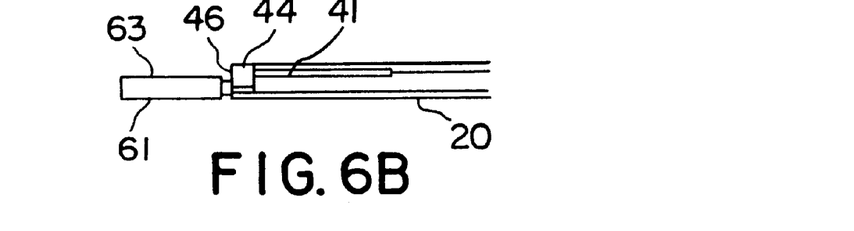
FIG. 6B is a lateral side view of the removable extension of FIG. 6A.

As illustrated in FIGS. 6A and 6B, in a second preferred embodiment of the present invention, a removable extension 61 is used to assist a user in locating opening 46 when inserting smart card 48 into PCMCIA smart card reader 20. Removable extension 61 can, for example, be inserted within cut-out portion 43 of front end 42 of bottom cover 26 of PCMCIA smart card reader 20. During transport of portable computer 56, removable extension 61 can easily be removed while PCMCIA smart card reader 20 remains within card slot 54.

As illustrated in FIG. 6B, when removable extension 61 is inserted within PCMCIA smart card reader 20, a top portion 63 of removable extension 61 is aligned at opening 46 with upper surface 41 of front end 42 of lower section 32. As a result, as illustrated in FIG. 6A, removable extension 61 guides smart card 48 by aligning smart card 48 vertically with opening 46, so that removable extension 61, in addition to flanges 44, make insertion of smart card 48 within PCMCIA smart card reader 20 easier.

Figure 7A:
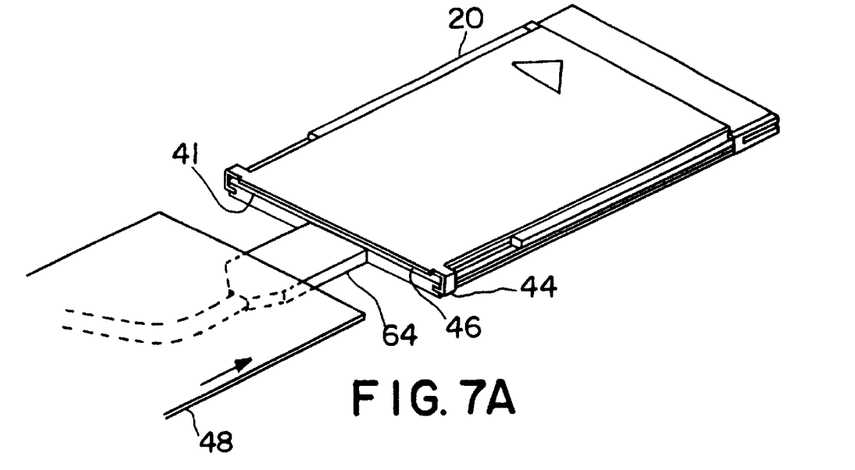
FIG. 7A is a perspective view of a removable extension of a PCMCIA smart card reader according to an another preferred embodiment of the present invention.
Figure 7B:
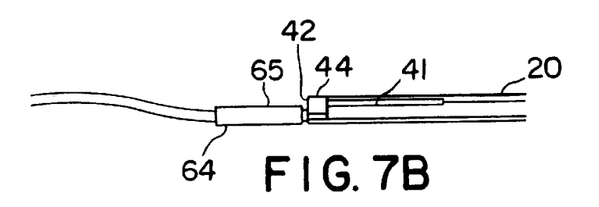
FIG. 7B is a lateral side view of the removable extension of FIG. 7A.

As illustrated in FIGS. 7A and 7B, according to a further preferred embodiment of the present invention, removable extension 61 may be integrated with an input\output connector 64, such as a connector for a telephone line cable. Input\output connector 64 is inserted within female connecting portion 40 at the front end of printed circuit board 24 of PCMCIA smart card reader 20. As illustrated in FIG. 7B, when input\output connector 64 is inserted within PCMCIA smart card reader 20, a top portion 65 of input\output connector 64 is aligned with upper surface 41 of front end 42 of lower section 32. As a result, as illustrated in FIG. 7A, input\output cable 64 guides smart card 48 by aligning smart card 48 vertically with opening 46, so that input\output connector 64, in addition to flanges 44, make insertion of smart card 48 within PCMCIA smart card reader 20 easier.

Figure 8A:
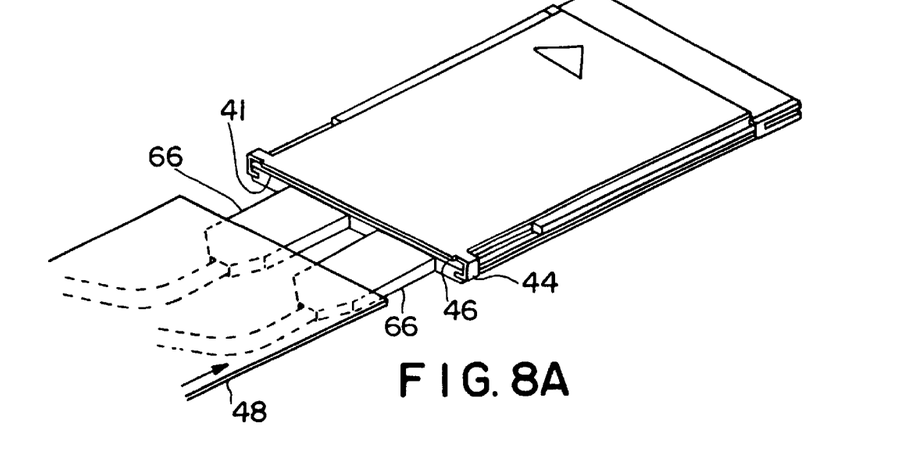
FIG. 8A is a perspective view of a removable extension of a PCMCIA smart card reader according to an another preferred embodiment of the present invention.
Figure 8B:
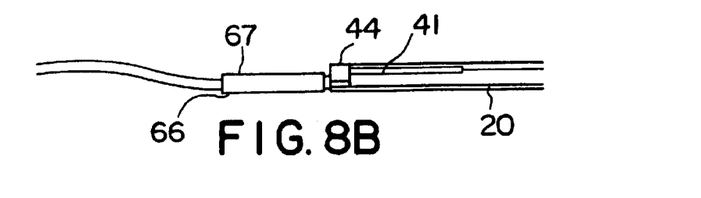
FIG. 8B is a lateral side view of the removable extension of FIG. 8A.

Certain applications require the use of more than one input/output cable. As illustrated in FIGS. 8A and 8B, according to a further preferred embodiment of the present invention, removable extension 61 may be integrated with more than one input\output connector. For example, two input\output connectors 66, such as one connector for a telephone line cable and one connector for LAN cable may be used. Input\output cables 66 are inserted within corresponding female connecting portions (not shown) at the front end of printed circuit board 24 of PCMCIA smart card reader 20. As illustrated in FIG. 8B, when input\output connectors 66 are inserted within PCMCIA smart card reader 20, a top portion 67 of input\output connectors 66 is aligned with upper surface 41 of front end 42 of lower section 32. As a result, as illustrated FIG. 8A, input\output connectors 66 guide smart card 48 by aligning smart card vertically with opening 46, so that input\output cables 66, in addition to flanges 44, make insertion of smart card 48 within PCMCIA smart card reader 20 easier.

Since input/output connector 64 and input\output connectors 66 are normally removed by the user when portable computer 56 is transported, input/output connector 64 and input\output connectors 66 act as a removable extension of PCMCIA smart card reader 20 which is easily and automatically removed during transport of portable computer 56 into which PCMCIA smart card reader 20 has been inserted for use. Since the extension is formed by input/output connector 64 or input\output connectors 66, rather than by PCMCIA smart card reader 20, the extension does not protrude from outside card slot 54 of portable computer 56 during transport, and is therefore not prone to mechanical damage.

Although the preferred embodiments shown here describe a PCMCIA smart card reader where the thin upper section 31 includes reading member 23 and the lower section 32 includes printed circuit board 24, it will be understood that the invention could be realized upside down, with the lower section 32 being thinner and including reading member 23 and the upper section 31 including printed circuit board 24. In such case, the smart card has to be inserted with its termination points downwards.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A smart card reading apparatus to fit inside a PCMCIA slot in a computing device having an insertion opening for a PCMCIA card in front of a pair of parallel PCMCIA guides located within the computing device and spaced apart to fit a standard size PCMCIA card, the smart card reading apparatus comprising:

upper and lower sections having at,a front end an opening to form a smart card slot for insertion of a smart card having standard dimensions; and a lateral smart card guide member located close to the front end of the smart card slot, said lateral smart card guide member being equal to or shorter than the distance between said insertion opening and said front end of said PCMCIA guides, whereby the lateral smart card guide member is located in front of and outside said PCMCIA guides, and the smart card reading apparatus can fit within the PCMCIA slot without interference between said lateral smart card guide member and said pair of PCMCIA guides located within the computing device.

2. A smart card reading apparatus according to claim 1, wherein said lateral guide member is a mechanical support member connecting said upper and lower sections.

3. A smart card reading apparatus according to claim 2, wherein said lateral guide member is integral with the upper section.

4. A smart card reading apparatus according to claim 2, comprising a connecting part in the front end of said lower section to receive a removable extension to said lower section.

5. A smart card reading apparatus according to claim 4, wherein said connecting part includes electrical connectors, and said removable extension is a cable connection.

6. A smart card reading apparatus according to claim 2, wherein electrical contacts to interface with terminating points on a smart card inserted into said smart card slot are arranged in said upper section.

7. A smart card reading apparatus according to claim 2, comprising circuits for a communication device and circuits for smart card reading.

8. A smart card reading apparatus to fit inside a PCMCIA slot in a computing device, comprising:
    a thin first section;
    a second section having electronic components for the smart card reader;
    said first and second sections having at a front end an opening to form a smart card slot for insertion of a smart card; and
    interfacing means for communicating with a smart card inserted into said smart card slot arranged in said thin first section.

9. A smart card reading apparatus according to claim 8, further comprising a smart card guide member located adjacent the front end outside the smart card slot and positionable inside the PCMCIA slot.

10. A smart card reading apparatus according to claim 9, wherein said guide member is a mechanical support member connecting said upper and lower sections.

11. A smart card reading apparatus according to claim 10, wherein said mechanical support member is integral with the upper section.

12. A smart card reading apparatus according to claim 9, comprising a connecting part in the front end of said lower section to receive a removable extension to said lower section.

13. A smart card reading apparatus according to claim 12, wherein said connecting parts include electrical connectors, and said removable extension is a cable connection.

14. A smart card reading apparatus according to claim 8, comprising circuits for a communication device and circuits for smart card reading.

15. A smart card reading apparatus to fit inside a PCMCIA slot in a computing device, comprising:
    upper and lower sections having at a front end an opening to form a smart card slot for insertion of a smart card; and
    a connecting part in the front end of said lower section to receive a removable extension to support a smart card vertically during and after insertion in said smart card slot.

16. A smart card reading apparatus according to claim 15, wherein said connecting part includes electrical connectors, and said removable extension is a cable connection.

17. A smart card reading apparatus according to claim 15, further comprising a smart card guide member located adjacent the front end outside the smart card slot and positionable inside the PCMCIA slot.

18. A smart card reading apparatus according to claim 17, wherein said guide member is a mechanical support member connecting said upper and lower sections.

19. A smart card reading apparatus according to claim 18, wherein said guide member is integral with the upper section.

20. A smart card reading apparatus according to claim 15, wherein interfacing means for communicating with a smart card inserted into said smart card slot is arranged in said upper section.

21. A smart card reading apparatus according to claim 15, comprising circuits for a communication device and circuits for smart card reading.

* * * * *